United States Patent
Cheng et al.

(10) Patent No.: US 10,659,058 B1
(45) Date of Patent: May 19, 2020

(54) SYSTEMS AND METHODS INVOLVING LOCK LOOP CIRCUITS, DISTRIBUTED DUTY CYCLE CORRECTION LOOP CIRCUITRY

(71) Applicant: GSI Technology, Inc., Sunnyvale, CA (US)

(72) Inventors: Yu-Chi Cheng, Sunnyvale, CA (US); Patrick Chuang, Sunnyvale, CA (US)

(73) Assignee: GSI TECHNOLOGY, INC., Sunnyvale, CA (US)

(*) Notice: Subject to any disclaimer, the term of this patent is extended or adjusted under 35 U.S.C. 154(b) by 0 days.

(21) Appl. No.: 15/193,699

(22) Filed: Jun. 27, 2016

Related U.S. Application Data

(60) Provisional application No. 62/185,260, filed on Jun. 26, 2015.

(51) Int. Cl.
| | |
|---|---|
| *H03L 7/081* | (2006.01) |
| *H03K 5/156* | (2006.01) |
| *G11C 7/22* | (2006.01) |
| *G06F 1/10* | (2006.01) |

(52) U.S. Cl.
CPC .............. *H03L 7/0812* (2013.01); *G06F 1/10* (2013.01); *G11C 7/222* (2013.01); *H03K 5/1565* (2013.01)

(58) Field of Classification Search
CPC ... H03L 7/06; H03L 7/08; H03L 7/081; H03L 7/0812; G11C 7/222; H03K 3/017; H03K 5/04–06; H03K 5/15; H03K 5/1565; H03K 7/08; G06F 1/04; G06F 1/10; G06F 1/12
See application file for complete search history.

(56) References Cited

U.S. PATENT DOCUMENTS

| | | | | |
|---|---|---|---|---|
| 5,008,636 | A * | 4/1991 | Markinson | G06F 1/06 331/2 |
| 6,897,696 | B2 * | 5/2005 | Chang | H03K 5/1506 327/175 |
| 6,940,328 | B2 * | 9/2005 | Lin | H03K 5/1565 327/172 |
| 8,294,502 | B2 * | 10/2012 | Lewis | H03K 5/13 327/261 |
| 8,643,418 | B2 * | 2/2014 | Ma | H03K 19/00361 327/170 |
| 9,059,691 | B2 * | 6/2015 | Lin | H03K 3/017 |
| 2014/0125390 | A1 * | 5/2014 | Ma | H03K 5/1565 327/175 |

* cited by examiner

*Primary Examiner* — Patrick O Neill
(74) *Attorney, Agent, or Firm* — DLA Piper LLP (US)

(57) ABSTRACT

A system, method and circuits are described that pertain to locked loop circuits, distributed duty cycle correction loop circuitry. In some embodiments, the system and circuit may involve or be configured for coupling with lock loop circuitry such as phase locked loop (PLL) circuitry and/or a delay locked loop (DLL) circuitry. For example, one illustrative implementation may include or involve a phase locked loop (PLL) with distributed duty cycle correction loop/circuitry.

30 Claims, 17 Drawing Sheets

PLL Block Diagram
(PRIOR ART)

PLL with clock tree (M=N=1)
(PRIOR ART)

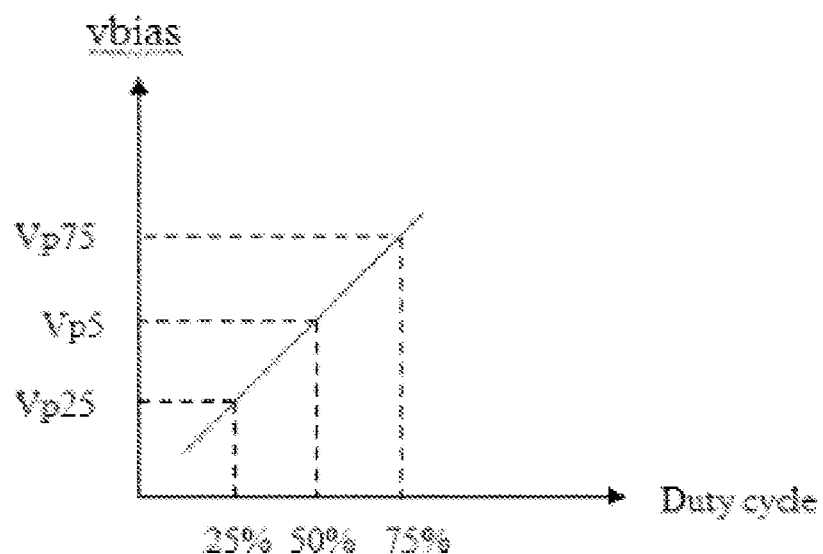
Fig. 5 Ideal Duty Cycle Detector transfer curve
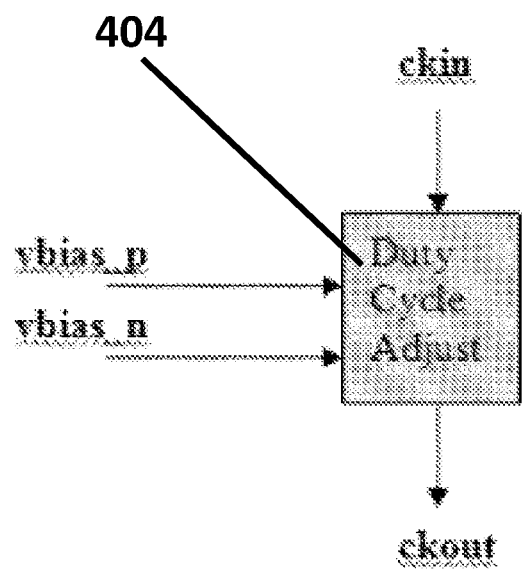
Fig. 6 Duty Cycle Adjustment circuit

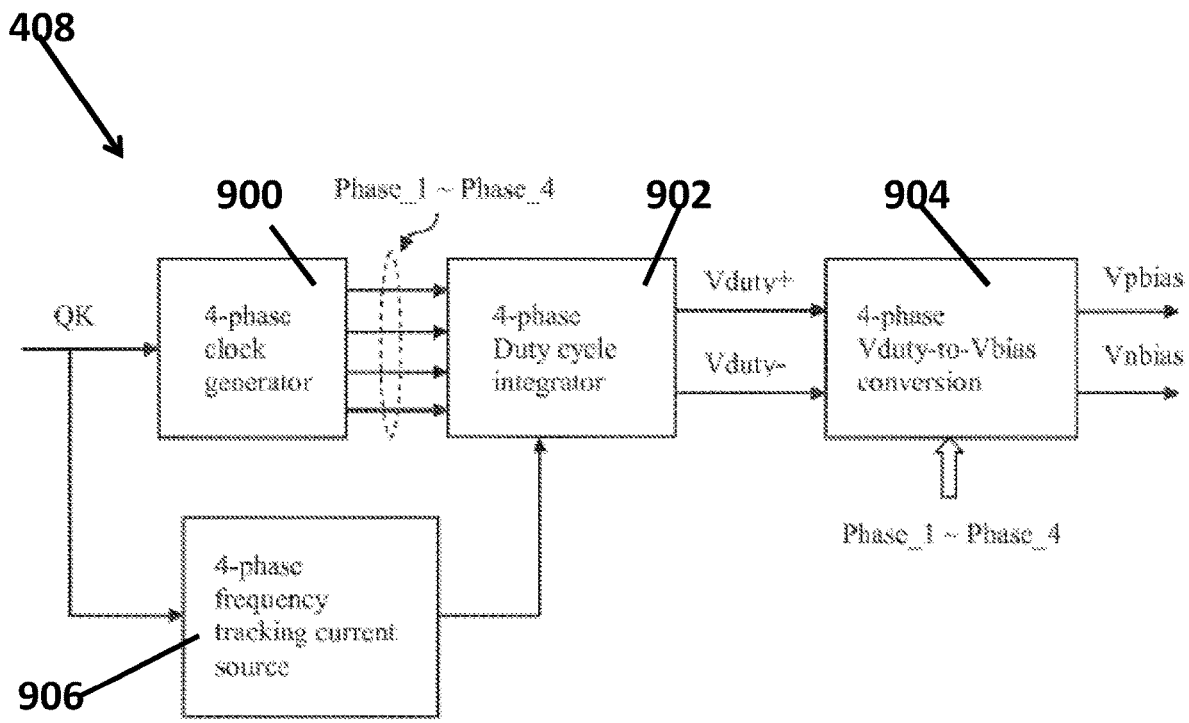
Figure 9: 4-phase Duty Cycle Detector:
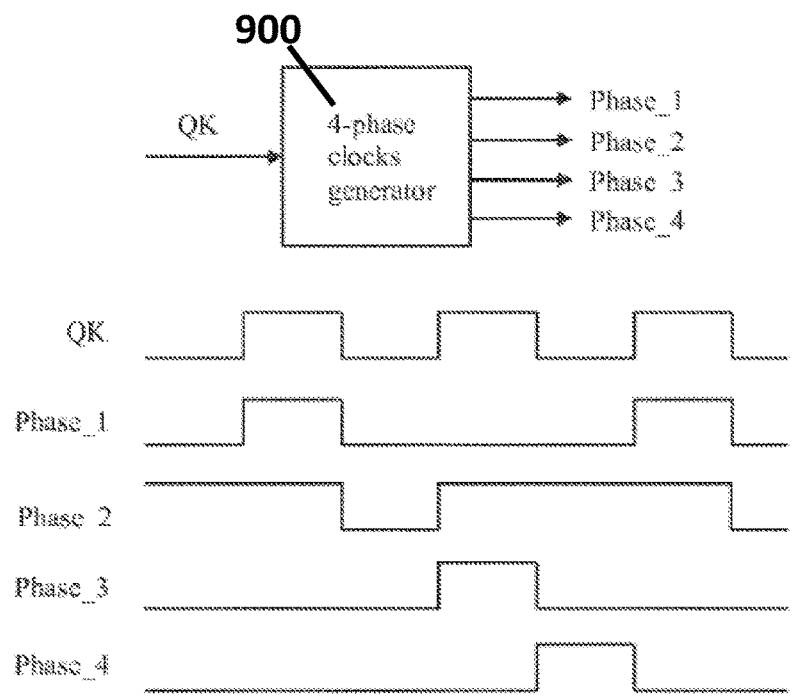
Figures 10A and 10B: 4-Phase Clock Generator

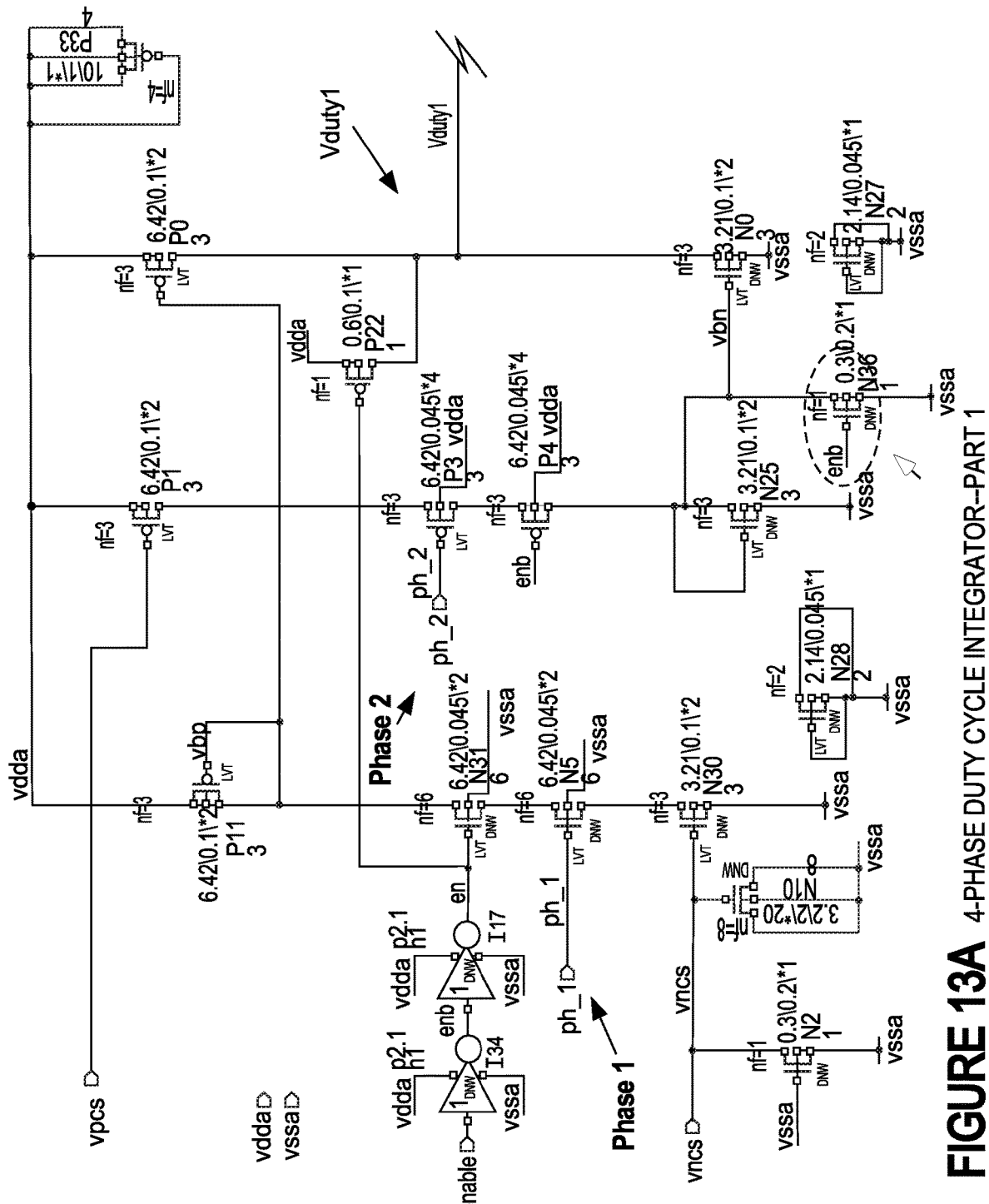
FIGURE 13A 4-PHASE DUTY CYCLE INTEGRATOR–PART 1

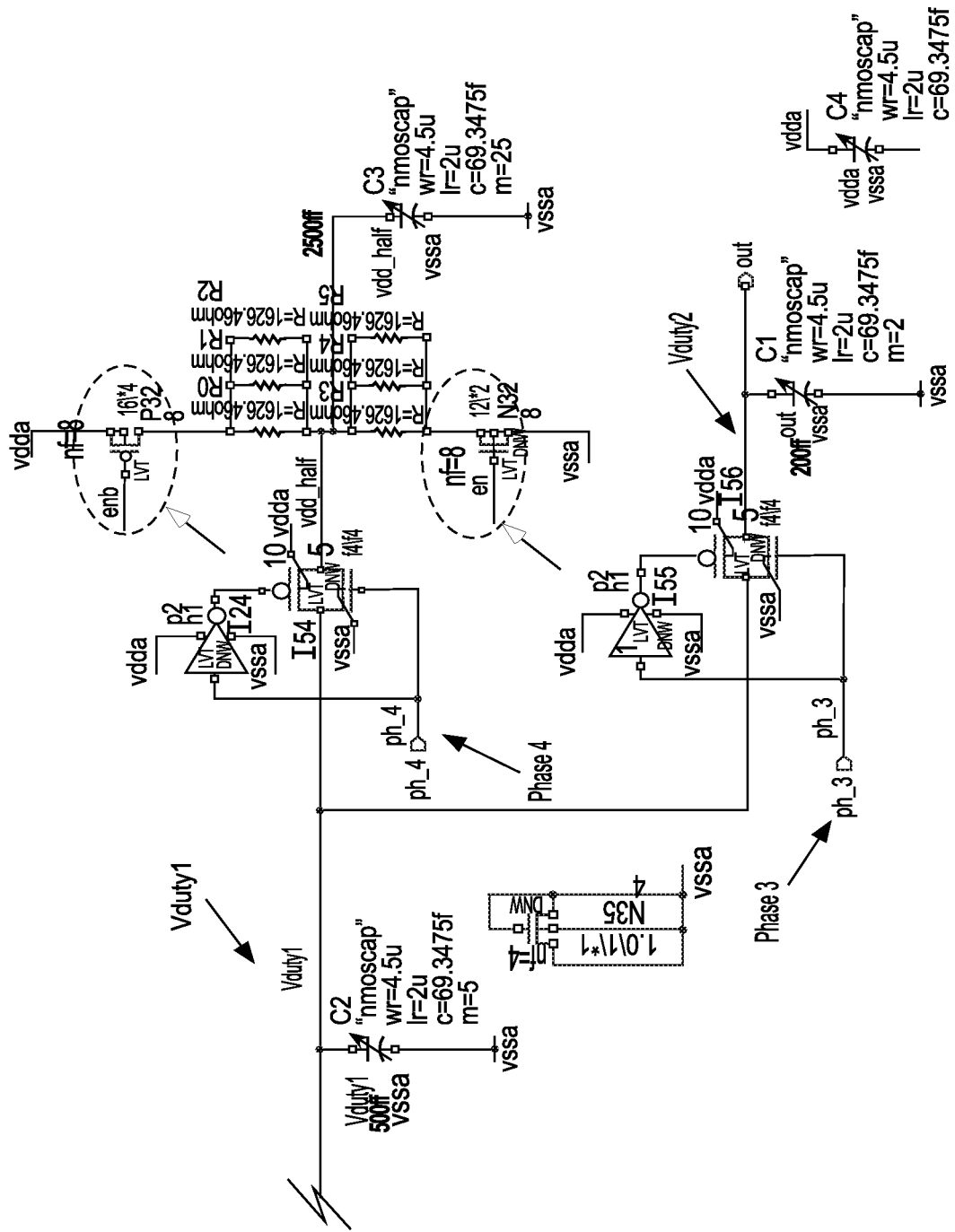
FIGURE 13B 4-PHASE DUTY CYCLE INTEGRATOR--PART 2

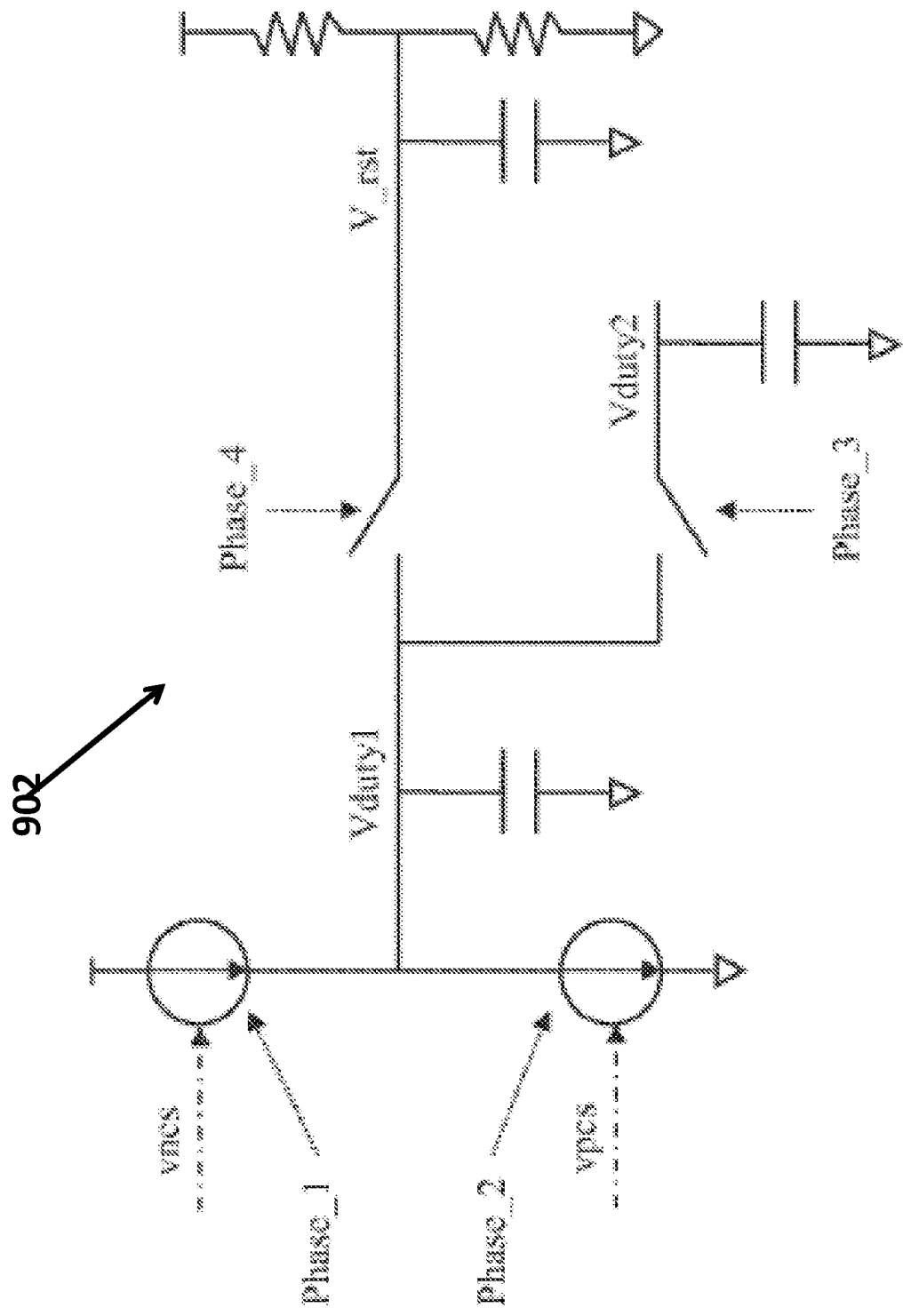
Figure 14: 4-phase Duty Cycle integrator

Figure 16: 4-phase Vduty to Vbias conversion circuit

Figure 18: Duty Cycle Adjustment delay chain:

SYSTEMS AND METHODS INVOLVING LOCK LOOP CIRCUITS, DISTRIBUTED DUTY CYCLE CORRECTION LOOP CIRCUITRY

PRIORITY CLAIMS/RELATED APPLICATIONS

This patent application claims the benefit under 35 USC 119(e) and 120 to U.S. Provisional Patent Application Ser. No. 62/185,260, filed on Jun. 26, 2016 and entitled "Systems And Methods Involving Lock Loop Circuits, Distributed Duty Cycle Correction Loop Circuitry As Well As Interrelated And/Or Associated Aspects", the entirety of which is incorporated herein by reference.

APPENDIX

Appendix A (5 pages) contains various illustrative circuit diagrams of the circuits described in the specification. Appendix A forms part of the specification and is also incorporated herein by reference in its entirety. Appendix A (pages 1A and 1B) shows the circuitry of the 4-phase Frequency tracking current source generator 906 (whose functional block diagram is shown in FIG. 15) while pages 2-4 of Appendix A show circuitry for a 4-phase Vduty-to-Vbias convertion circuit 904 (whose functional block diagram is shown in FIG. 16.)

FIELD

The disclosure relates generally to lock loop circuits, and more specifically, to related systems and methods involving distributed duty cycle correction (DCC) loop/circuitry.

BACKGROUND

Lock or locked loop circuits, such as phase locked-loop (PLL) and delay locked-loop (DLL) circuitry, are widely used as clock generators for a variety of applications including microprocessors, wireless devices, serial link transceivers, disk drive electronics, and so forth. FIG. 1 illustrates a typical charge pump based PLL circuit 110 that may include phase frequency detector PFD 110, charge pump CP 120, loop filter LPF 130, voltage control oscillator VCO 140, and dividers/M 150 and/N 152.

The PLL 100 of FIG. 1 has a voltage control oscillator VCO 140 that generates an output clock CKOUT that is frequency locked and phase aligned with an input clock CKIN due to the negative feedback loop. The output clock frequency is defined by the equation CKOUT=CKIN*(N/M), when the PLL 100 is in the lock condition. The inputs ckref and ckfb of the phase frequency detector PFD will be phase aligned to each other.

As illustrated in circuit 200 of FIG. 2, a clock tree 220 may be added at the output of the PLL/DLL 210. The output of the clock tree QK is required to be phased aligned with CKIN. FIG. 2 is a simplified version of a PLL/DLL with a clock tree where M=1 and N=1.

FIG. 3A illustrates a block diagram of an example phase lock loop circuit having Duty Cycle Correction (DCC) circuitry at the output, outside the loop, as known in the art. Referring to FIG. 3A, a prior art of PLL/DLL with Duty Cycle Correction (DCC) near QK is shown. In this case, DCC is outside PLL loop.

FIG. 3B illustrates a block diagram of an example phase lock loop circuit having Duty Cycle Correction (DCC) circuitry within the loop, coupled directly between the PLL and the clock tree circuitry, as known in the art. Referring to FIG. 3B, another prior art PLL/DLL is shown, including Duty Cycle Correction (DCC) circuitry directly at the output of PLL, before the clock tree.

As set forth below, one or more exemplary aspects of the disclosure may overcome such shortcomings and/or otherwise impart innovative aspects by, for example, providing circuitry that reduces skew between an input clock and a plurality of clock tree outputs.

BRIEF DESCRIPTION OF THE DRAWINGS

The accompanying drawings, which constitute a part of this specification, illustrate various implementations and aspects of the disclosure and, together with the description, explain the principles of the disclosure. In the drawings:

FIG. 5 illustrates an exemplary transfer curve (Vbias vs. Duty Cycle) of an ideal Duty Cycle Detector.

FIG. 6 is a block diagram illustrating exemplary duty cycle adjustment circuitry.

FIG. 9 is a block diagram illustrating exemplary 4-phase duty cycle detector circuitry.

FIGS. 10A and 10B illustrates exemplary 4-phase clock generator circuitry and a diagram of associated signal phase/timing waveform information.

FIGS. 13, 13A, and 13B is a block/circuit diagram illustrating an exemplary 4-phase duty integrator circuitry.

FIG. 14 is a block/circuit diagram illustrating additional exemplary 4-phase duty integrator circuitry.

DETAILED DESCRIPTION OF ONE OR MORE EMBODIMENTS

The disclosure is particularly applicable to clock circuits for semiconductor devices, such as memories like SRAMs and DRAMs, and it is in this context that the disclosure will be described. It will be appreciated, however, that the system, circuits and methods in accordance with the disclosure has greater utility since it may be used with any device or method that uses a clock circuit. For example, the lock loop circuit may be part of a clock circuit in a semiconductor memory that has an array of memory elements.

Overview

Systems, methods and circuits consistent with the innovations herein pertain to locked loop circuits, distributed duty cycle correction loop circuitry, and/or associated aspects. Exemplary implementations herein may include, involve or be configured for coupling with lock loop circuitry such as phase locked loop (PLL) circuitry and/or a delay locked loop (DLL) circuitry. For example, one illustrative implementation may include or involve a phase locked loop (PLL) with distributed duty cycle correction loop/circuitry. Systems and methods herein may include or involve a phase locked loop (PLL) having an independent duty cycle correction loop coexisting with the main PLL loop. Additionally, some embodiments may include or involve a phase locked loop (PLL) with a duty cycle correction loop, where duty cycle adjustment resides in the main PLL loop while duty cycle detection circuitry resides outside the main PLL loop. According to one specific implementation herein, duty cycle adjustment may be configured to only change the falling edge of the clock, with the PLL using only a rising clock edge for locking, such that the PLL loop and the DCC loop both can operate at the same time without interfering each other's operation. Further, in some implementations, duty cycle adjustment may be configured to operate only after the PLL loop is locked, or both the PLL loop and the DCC loop operate at the same time.

It is to be understood that both the foregoing general description and the following detailed description are exemplary and explanatory only and are not restrictive of the disclosure, as described. Further features and/or variations may be provided in addition to those set forth herein. For example, the disclosure may be directed to various combinations and subcombinations of the disclosed features and/or combinations and subcombinations of several further features disclosed below in the detailed description.

Figure 1:
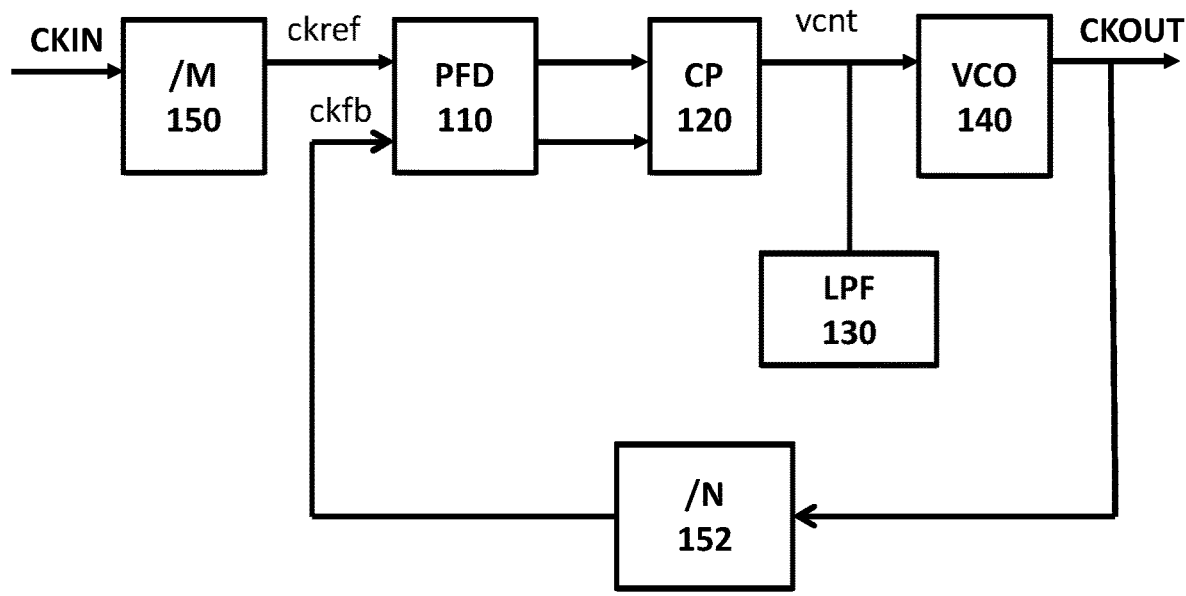
FIG. 1 illustrates a block diagram of an example phase lock loop (PLL) circuit as known in the art.
Figure 2:
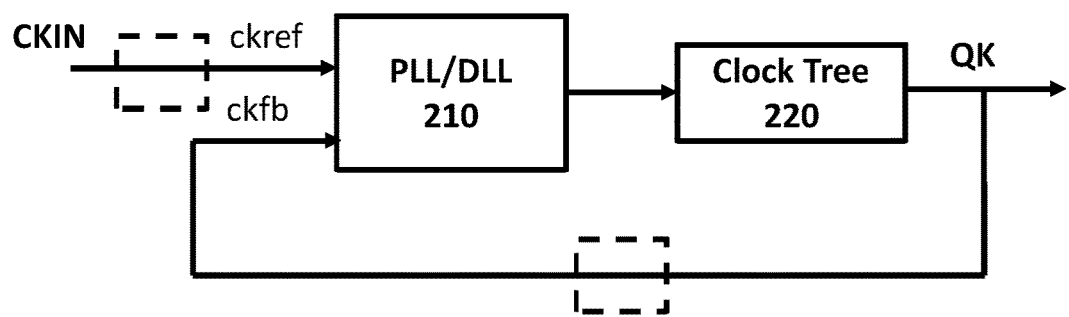
FIG. 2 illustrates a block diagram of an example phase lock loop circuit with a clock tree as known in the art.
Figure 3A:
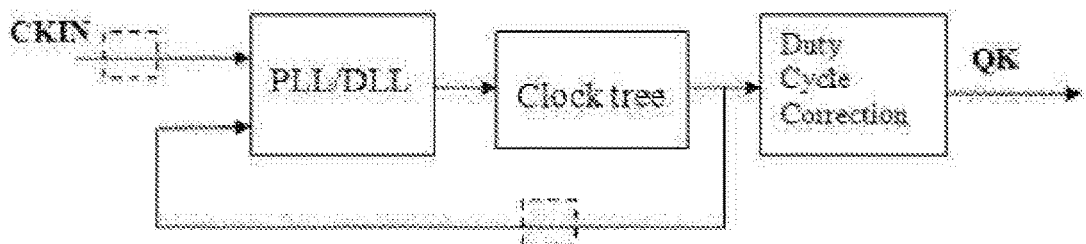
FIG. 3A illustrates a block diagram of an example phase lock loop circuit having Duty Cycle Correction (DCC) circuitry at the output, outside the loop, as known in the art.
Figure 3B:
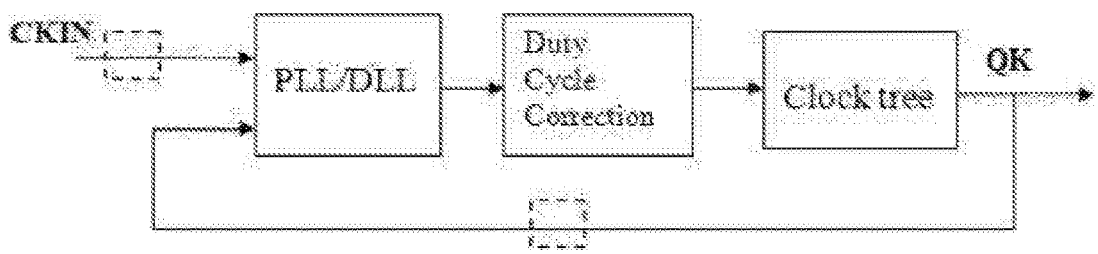
FIG. 3B illustrates a block diagram of an example phase lock loop circuit having Duty Cycle Correction (DCC) circuitry within the loop, coupled directly between the PLL and the clock tree circuitry, as known in the art.
Figure 4:
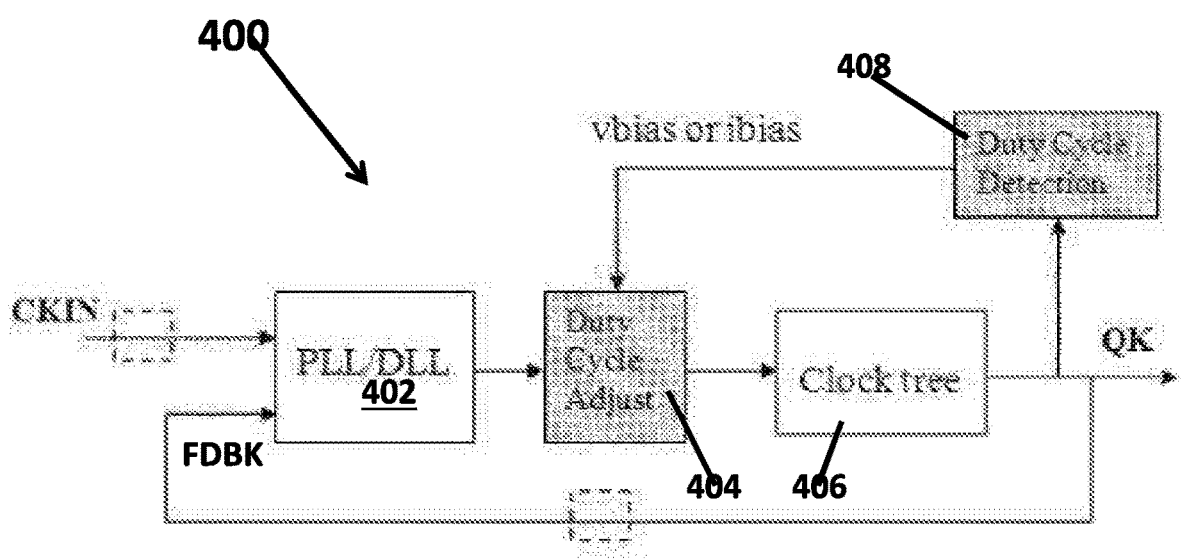
FIG. 4 is a block diagram illustrating one exemplary lock loop circuit with duty cycle detection and adjustment circuitry.

FIG. 4 is a block diagram illustrating one exemplary lock loop circuit 400 with duty cycle detection and adjustment circuitry. Exemplary implementations consistent with FIG. 4 may include, involve or be configured for coupling with lock loop circuitry such as phase locked loop (PLL) circuitry and/or a delay locked loop (DLL) circuitry. By way of illustrative, various systems and methods herein may include or involve a phase locked loop (PLL) with distributed duty cycle correction loop/circuitry. Such a system 400 is shown, for example, in FIG. 4, including lock loop circuitry 402, such as a phase lock loop (PLL) or a delay lock loop (DLL), clock tree circuitry 406, duty cycle detection (DCD) circuitry 408 and duty cycle adjustment (DCA) circuitry 404 connected to each other as shown in FIG. 4. The Duty Cycle Detector (DCD) circuitry 408 may be utilized to detect a duty cycle of a signal QK (as shown in FIG. 4 being output from the clock tree circuitry 406) and generate voltage bias or current bias signals, which can be used to control the Duty Cycle Adjust (DCA) circuit 404 and thus adjust the duty cycle at the input of the clock tree to achieve the desired duty cycle at QK. Further, this Duty Cycle Correction (DCC) loop may be operated independently such that it does not affect main PLL loop stability. As set forth in more detail below, by means of such circuitry and the present innovations, implementations herein may make the output, QK, at the very end of the clock tree a 50% duty cycle clock and also to minimize the delay in the clock tree and the input clock path (CKIN in FIG. 4) and a feedback clock path (FDBK in FIG. 4) of PLL.

Accordingly, as shown in FIG. 4 and described in more detail in implementations below, systems and methods herein may include or involve a phase locked loop (PLL) having an independent duty cycle correction loop coexisting with the main PLL loop. Additionally, as shown and described, some embodiments may include or involve a phase locked loop (PLL) with a duty cycle correction loop, where duty cycle adjustment resides in the main PLL loop while duty cycle detection circuitry resides outside the main PLL loop.

FIG. 5 illustrates an exemplary transfer curve (Vbias vs. Duty Cycle) of an ideal Duty Cycle Detector 408. As shown in FIG. 5, linear and/or near ideal control of a Vbias or Ibias control signal generated by the duty cycle detector circuitry 408 may be achieved so that the desired duty clock cycle, may be achieved. As a detected duty cycle changes, for example, a corresponding Vbias signal may be generated to adjust the duty cycle via the duty cycle adjustment circuitry 404, to control the duty cycle of the output, QK.

Figure 17:
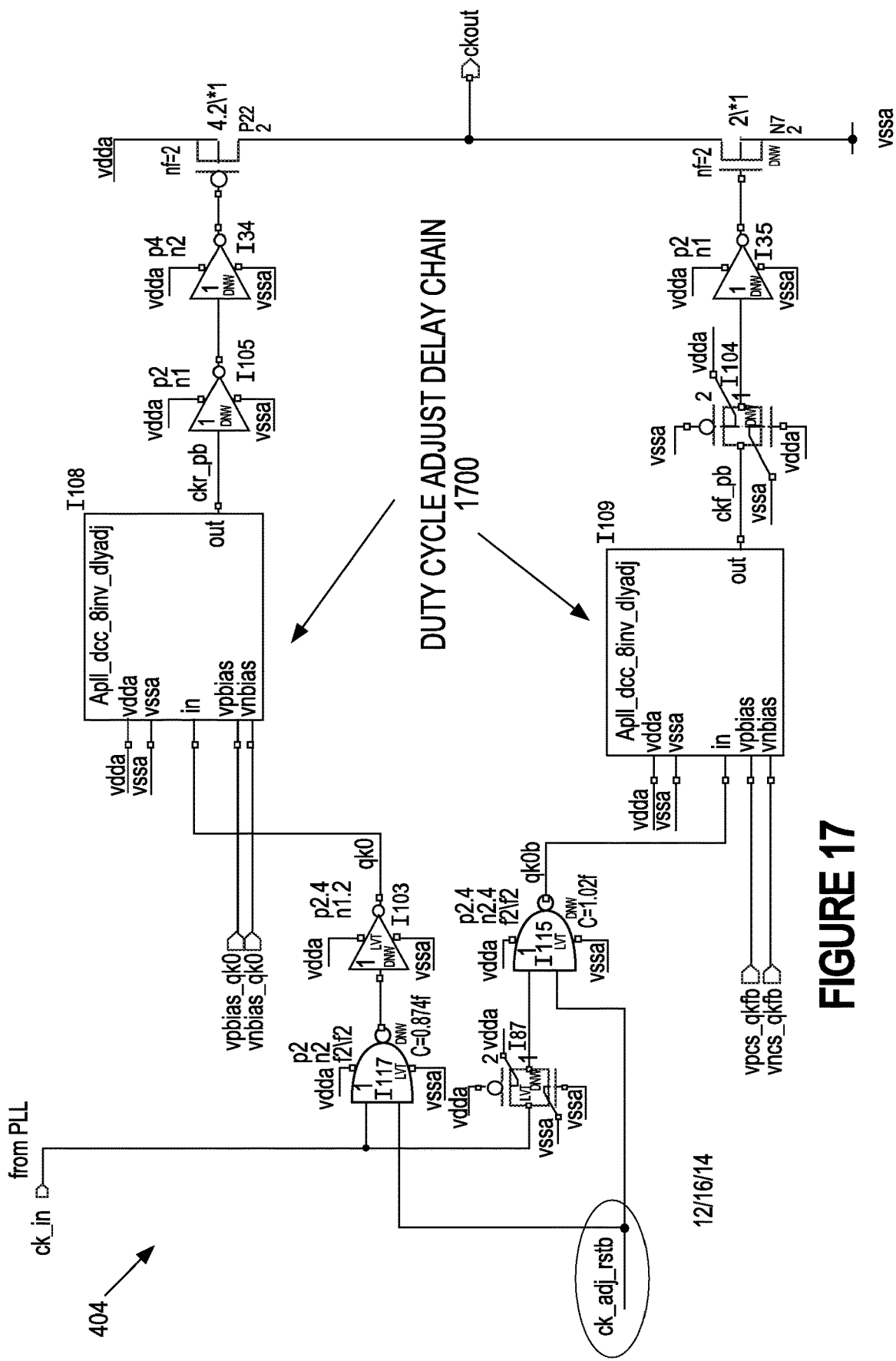
FIG. 17 is a block/circuit diagram illustrating exemplary duty cycle adjustment circuitry.

FIG. 6 is a block diagram illustrating exemplary duty cycle adjustment circuitry 404 wherein a ckin signal is an input clock, a ckout signal is an output and vbias_p and vbias_n are voltage bias signals that can change the duty cycle of the output, ckout. An example implementation of the duty cycle adjustment circuitry 404 is shown in FIG. 17 and described below. In the implementation shown in FIG. 17, considering that only changing the bias voltage of the ckb path in the following manner, when vbias_p increases, vbias_n decreases (in dual) such that duty cycle of ckout will increase, and when vbias_p decrease, vbias_n increase, the duty cycle of ckout will decrease. An alternate arrangement may also be implemented, wherein opposite increases/decreases of vbias_p and vbias_n (for example an increase in vbias_p and a decrease in vbias_n will cause the duty cycle of ckout to increase or decrease and vice versa) are utilized. Further, according to some implementations, the control signal utilized may be i_bias (current control) rather than vbias.

The principal of these types of DCAs shown in FIG. 6 is to control the slew rate of rising and falling through vbias_p and vbias_n, so that the desired duty cycle is achieved. Referring to FIG. 17, there are two paths, top one (ck) controls the rising edge of ckout, and bottom one (ckb) controls the falling edge of ckout. For illustration purposes, if the Vbias voltage of the top (ck) path in FIG. 17 is fixed and the Vbias of the ckb path is changed, if vbias_p is increased and vbias_n is decreased, then the falling edge path will have more delay due to the decrease in the driving cabability of the driver in each DCA cell, therefore falling edge is pushed further, thus duty cycle of the ckout will increase. The opposite direction of decreasing the duty cycle of ckout can be achieved if the same condition of Vbias is applied to the top (ck) path.

Figure 7:
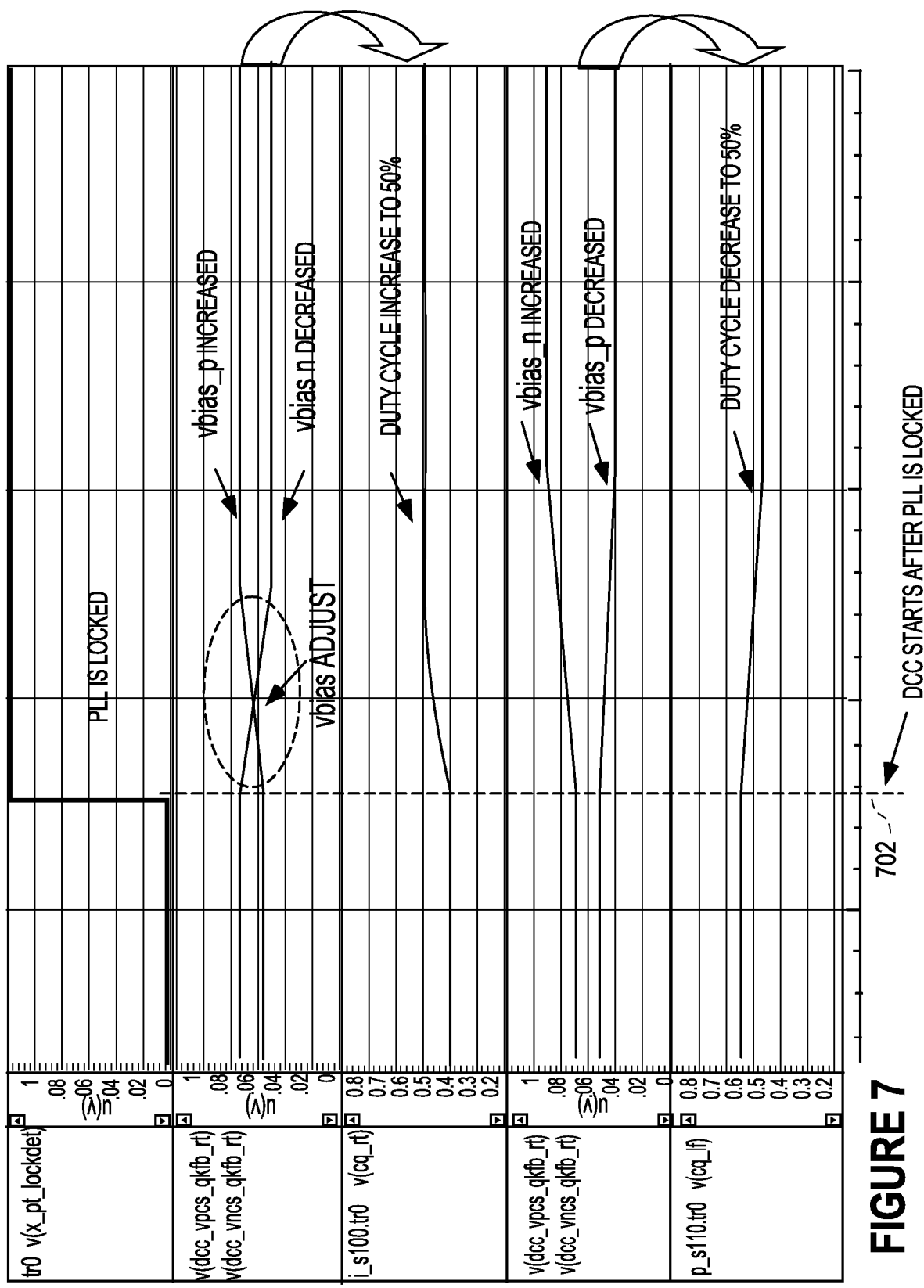
FIG. 7 is a timing diagram showing illustrative waveforms of duty cycle correction start and PLL locking features.

FIG. 7 is a timing diagram showing illustrative, representative waveforms of duty cycle correction start and PLL locking features, consistent with certain implementations of the circuits in FIG. 4 above. As seen and understood in connection with FIG. 7, a duty cycle correction may commence, at 702, right after PLL loop is locked, therefore PLL loop and DCC loop are operating in a sequential manner. More specifically, FIG. 7 shows two examples in which an adjustment of the voltage bias control signals changes the duty cycle of the output. In one example, vbias_p increases and vbias_n decreases to cause the duty cycle to increase by 50%. In the other example in FIG. 7, vbias_p decreases and vbias_n increases to cause the duty cycle to decrease by 50%. As above, the voltage bias control signals shown in FIG. 7 alternatively may be current bias control signals.

Figure 8:
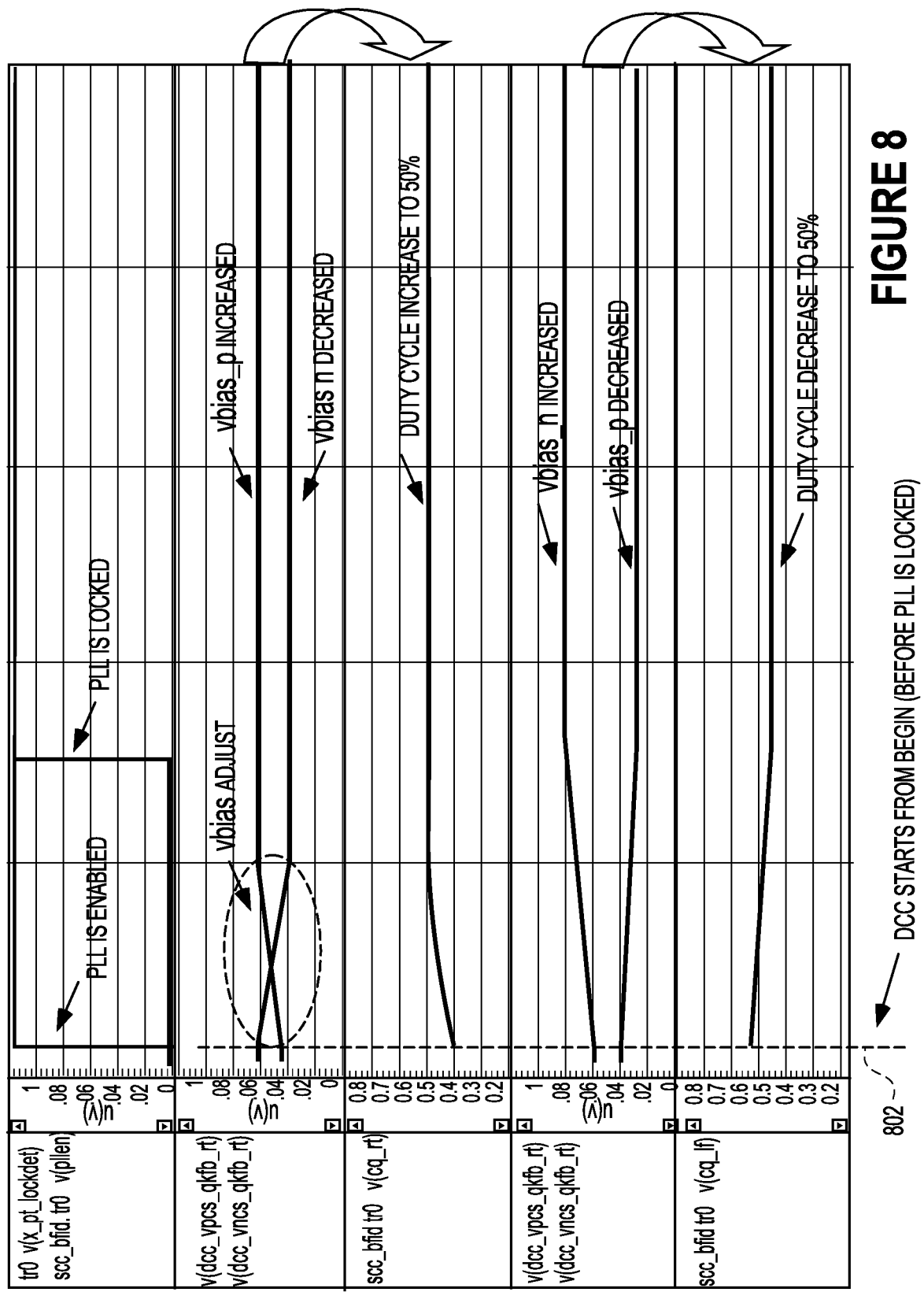
FIG. 8 is another timing diagram showing illustrative waveforms of duty cycle correction start and PLL enable and locking features.

FIG. 8 is another timing diagram showing illustrative waveforms of duty cycle correction start and PLL enable and locking features in which duty cycle correction may commence from the very beginning, once PLL is enabled at 802, which is significantly earlier than the time by which the PLL is locked. More specifically, FIG. 8 shows two examples in which an adjustment of the voltage bias control signals changes the duty cycle of the output. In one example, vbiasp increases and vbias_n decreases to cause the duty cycle to increase by 50%. In the other example in FIG. 7, vbiasp decreases and vbias_n increases to cause the duty cycle to decrease by 50%. As above, the voltage bias control signals shown in FIG. 8 alternatively may be current bias control signals. In addition, although FIG. 8 shows that the duty cycle change occurs at about the same time as shown in FIG. 7, the duty cycle change and the adjustment of the bias control signals may occur earlier than shown in FIG. 8 since the duty cycle correction begins earlier. As such, according to such implementations, the PLL loop and the DCC loop may be operative at the same time until both loops are settled down. This is one illustrative example showing how the PLL loop and the DCC loop may both operate at the same time without interfering or affecting each other's operation.

FIG. 9 is a block diagram illustrating an exemplary duty cycle detector circuitry 408 that may be a 4-phase duty cycle detector circuitry. According to some of the present systems and methods, innovative duty cycle detector implementations herein may include or involve circuitry based on the representative 4-phase clocking scheme, as described below for purpose of illustration and not limitation to various innovative aspects herein. Here, for example, it is noted and understood that, according to other implementations, modified or derivative versions of such clocking may be utilized, including but not limited to 3-phase, 6-phase, 8-phase, etc. Derivations with additional logic to process the signals are also within the ambit of innovations herein.

In the 4 phase implementation of the duty cycle detector circuitry 408, the duty cycle detector circuitry 408 may have a 4-phase clock generator circuitry 900, a 4-phase duty cycle integrator circuitry 902, a 4-phase Vduty to Vbias conversion circuitry 904, and a 4-phase frequency tracking current source circuitry 906. Additional details of this circuitry and operation of same is set forth below with respect to FIGS. 11-16.

FIGS. 10A and 10B illustrate exemplary 4-phase clock generator circuitry 900 and a diagram of associated signal phase/timing waveform information for the 4-phase clock generator circuitry 900. FIG. 10A shows the 4-phase clock generator circuitry 900 that receives the input signal, QK, and produces/generates output signals of 4 differing phases, Phase 1, Phase 2, Phase 3, and Phase 4. Exemplary detail of the phase relationships of these 4 signals with respect to the input signal, QK, are shown in FIG. 10B. Further details of the 4-phase clock generator circuitry 900 are shown in FIG. 12 and described below.

Figure 11:
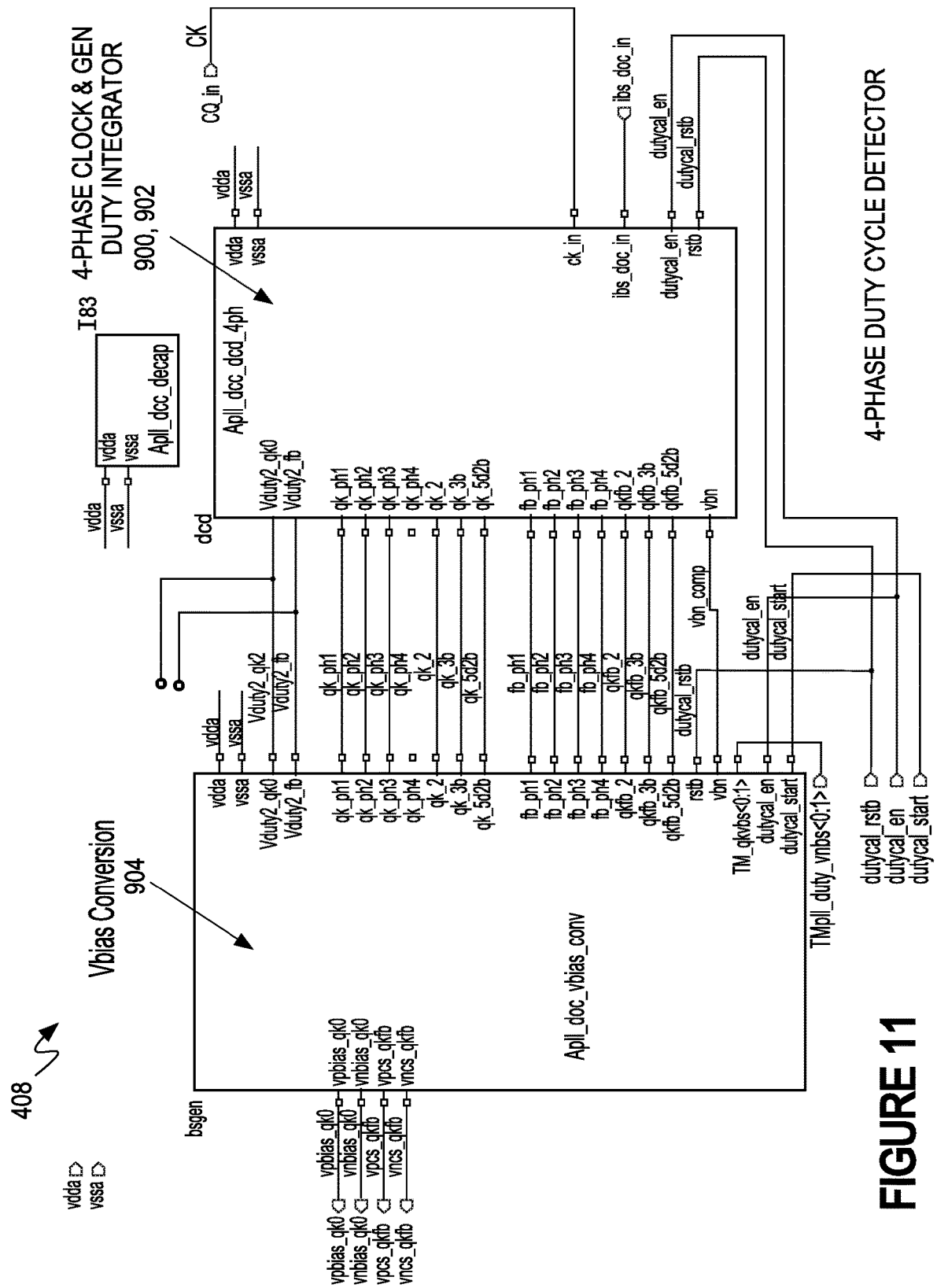
FIG. 11 is a block/circuit diagram illustrating exemplary 4-phase duty cycle detector circuitry.

FIG. 11 is a block/circuit diagram illustrating exemplary 4-phase duty cycle detector circuitry 408 including specifics of wiring, connections and signals for the Vbias conversion circuitry 904, the 4-phase clock generator 900 and duty integration circuitry 902. As shown, the clock input CK is feed into the 4-phase clock generator and 4-phase duty integrator (900,902) and this circuit detects the duty cycle of the input clock CK and outputs Vduty+ and Vduty− which represent the high pulse duration and low pulse duration of CK respectively. The outputs of the 4-phase clock generator and 4-phase duty integrator (900,902) are then feed into the Vbias Conversion circuit 904 that converts Vduty+ and Vduty− in FIG. 9 to Vnbias and Vpbias and these two signals are feed back to the Duty Cycle Adjuster (DCA) for adjusting the duty cycle of the CK.

Figure 12:
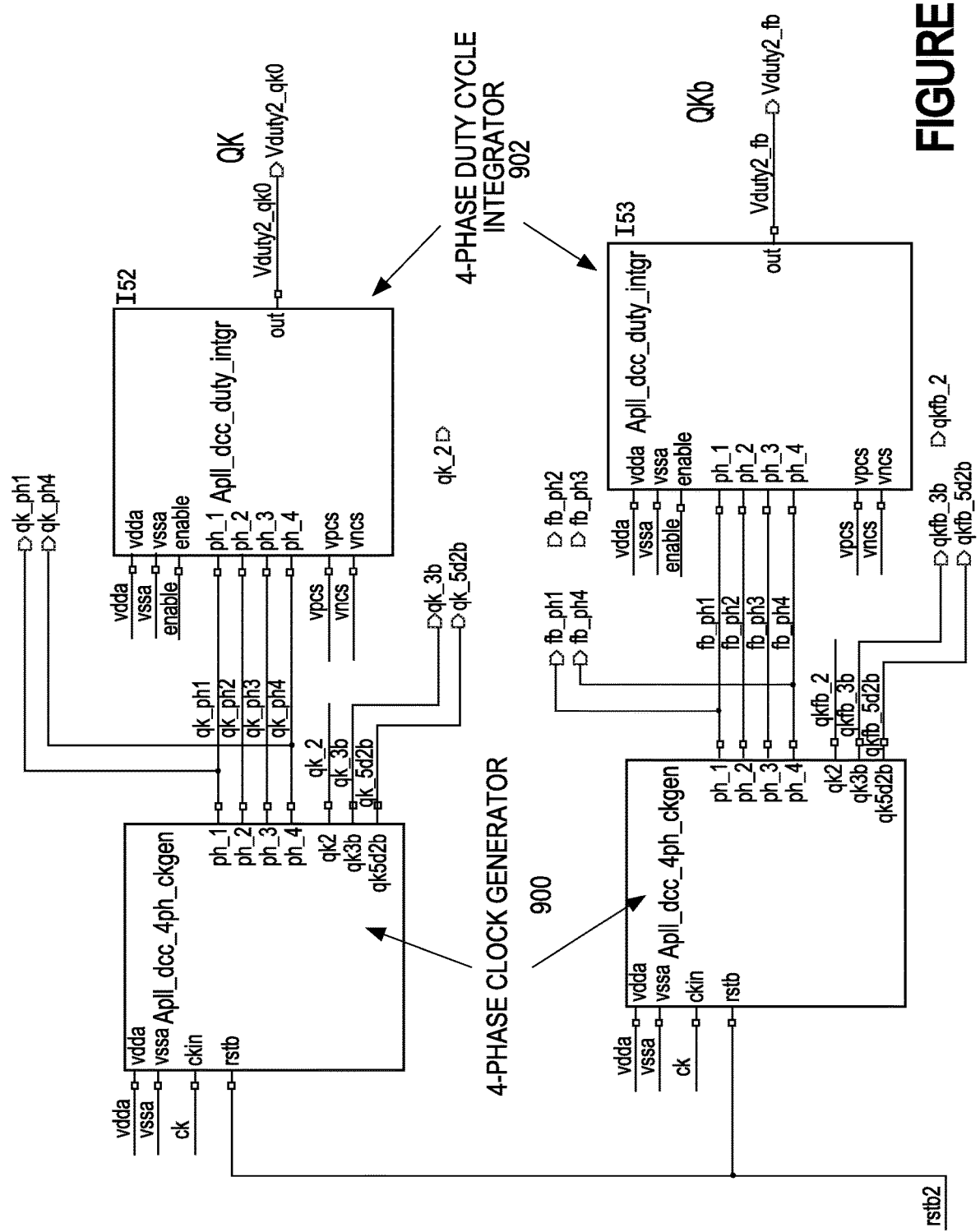
FIG. 12 is a block/circuit diagram illustrating exemplary 4-phase duty integrator with clock generation circuitry.

FIG. 12 is a block/circuit diagram illustrating exemplary 4-phase duty integrator 902 with clock generation circuitry 900 including specifics of wiring, connections and signals for the 4-phase clock generator circuitry and the 4-phase duty cycle integrator circuitry. In particular, FIG. 12 shows two sets of 4-phase clock generators and 4-phase cuty cycle integrators, one set for generating the Vduty+ signal and the other set for Vduty− signal. A detailed implementation of the circuit 902 is shown in FIGS. 13, 13A, and 13B.

Figure 13:
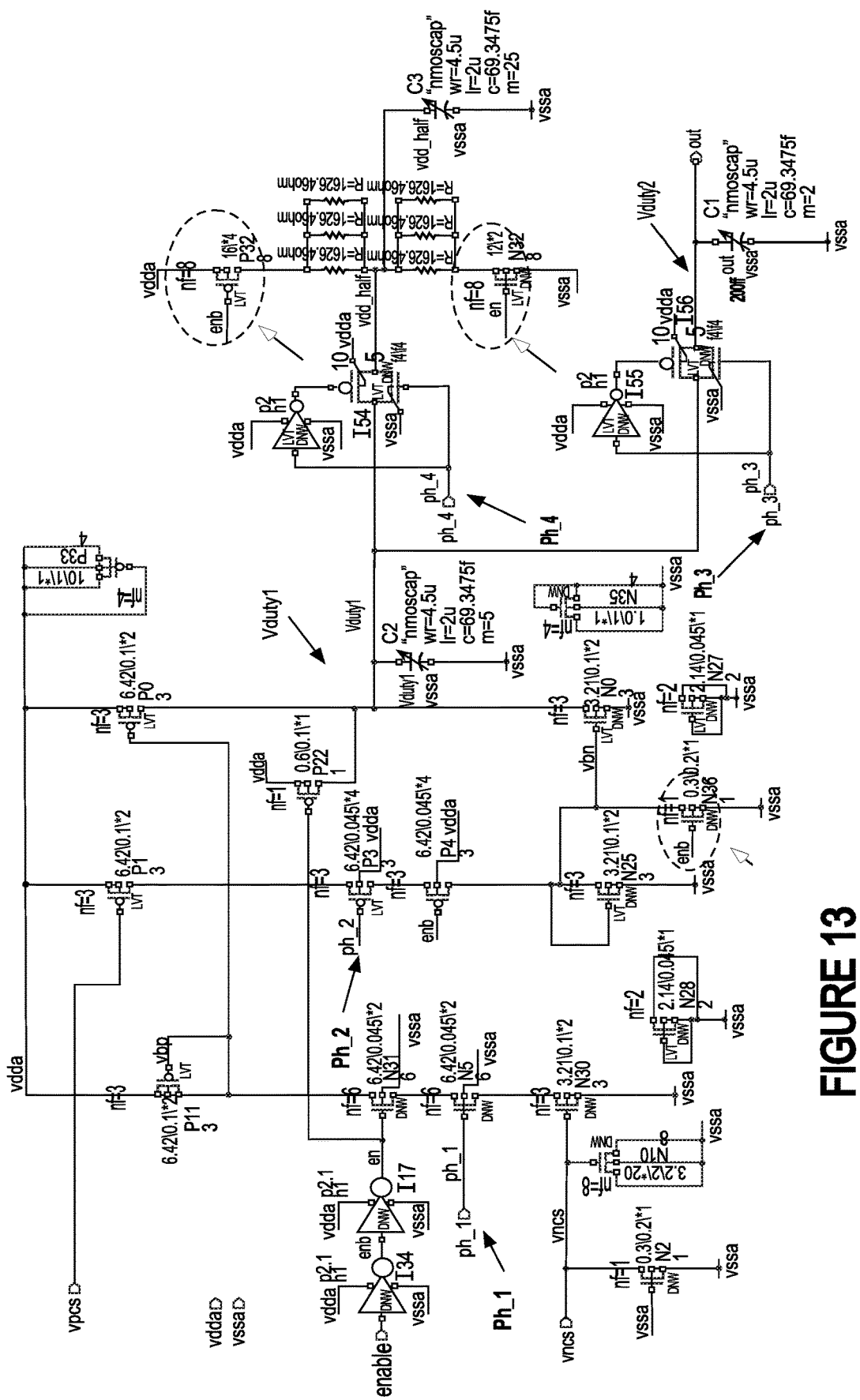

FIGS. 13, 13A, and 13B is a block/circuit diagram illustrating exemplary 4-phase duty integrator circuitry 902. In FIGS. 13, 13A, and 13B, additional detail is shown regarding the 4-phase duty integrator circuitry, including specifics of wiring, connections and signals regarding the Phase 1, Phase 2, and Vduty1 handling circuitry as well as the Phase 3, Phase 4, and Vduty1 and Vduty2 handling circuitry. By means of such exemplary circuitry, the illustrative 4-phase duty integrator circuitry, here, may generate a Vduty signal proportional to the QK duty cycle. In the circuit in FIGS. 13, 13A, and 13B, in Phase_4, Vduty1 is reset to a predetermined voltage (e.g. vdd/2). In Phase_1, CK is "high and Vduty1 is charge up for the duration of CK "high", and in Phase_2, CK is "low" and Vuty1 is discharged while CK is "low". In Phase_3 the Vduty1 voltage is then transferred to Vduty2, and in Phase_4 Vduty1 is reset to vdd/2, and the process repeats again.

FIG. 14 is a block/circuit diagram illustrating an additional, more generic exemplary 4-phase duty integrator circuitry 902 in which the exemplary 4-phase duty integrator circuitry 902 is shown, at a higher-level than the circuitry of FIGS. 13, 13A, and 13B. As shown in FIG. 14, the Phase_1 signal and the Phase 2 signal may be provided in series between a voltage source and ground, with their coupling point defining a first node at which a first duty voltage signal, Vduty1, is maintained. Additionally, the Phase 3 and the Phase 4 signals are applied at the output end of this first node, with the Phase 3 signal coupled to provide a second duty voltage signal, Vduty2, when it is high, and the Phase 4 signal coupled to provide a reset voltage, Vrst, when it goes high. Various resistive and capacitive elements may also be included at the various nodes, either explicitly or as representing the RC and load characteristics of the surrounding circuitry. Cycle. In this illustrative implementation, for example, the Phase_1 signal may control the upper current source and thus the charging operation for the capacitor connected to Vduty1, and the Phase 2 signal may control the lower current source and the discharging operation of the capacitor connected to Vduty1. However, in other implementations, the controlling scheme of Phase_1 and Phase 2 may also be swapped, such that Phase_1 controls the lower one and Phase 2 controls the upper one.

Figure 15:
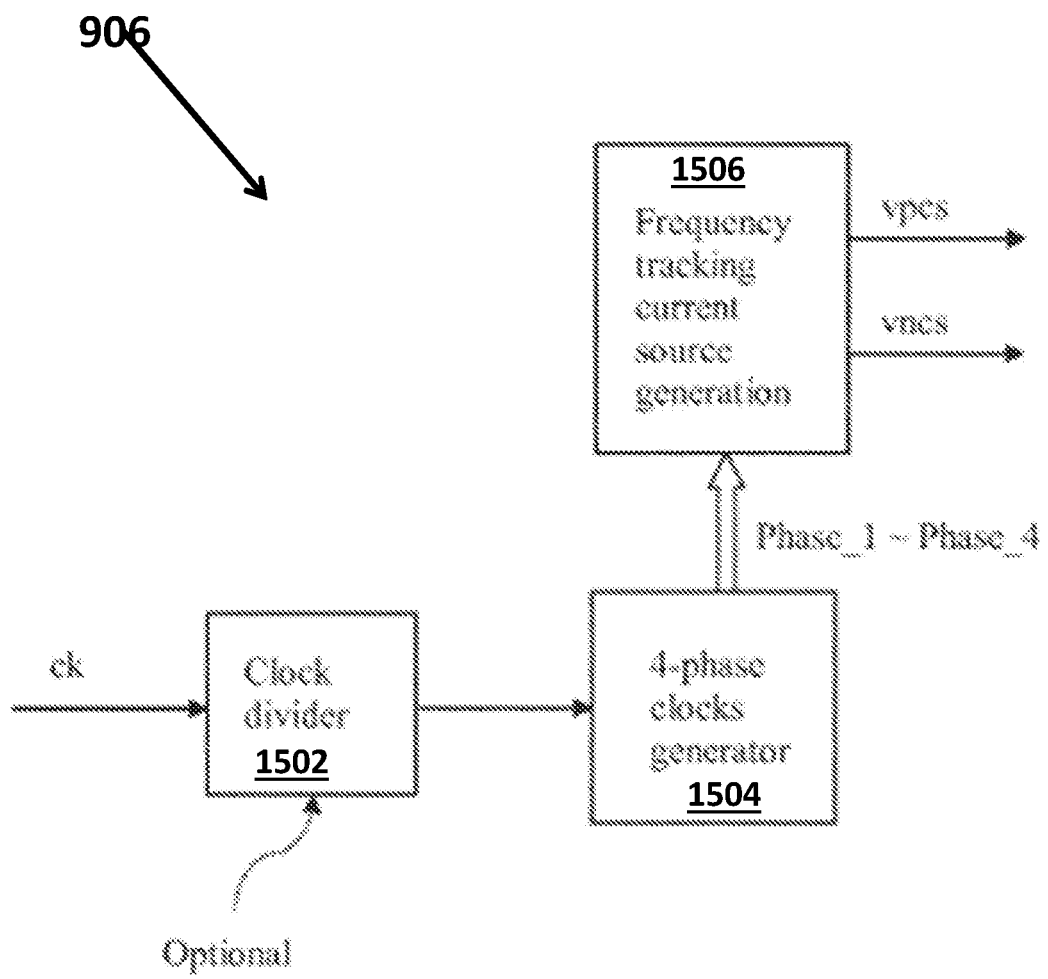
FIG. 15 is a block diagram illustrating aspects associated with 4-phase duty frequency tracking current source circuitry.
Figure 16:
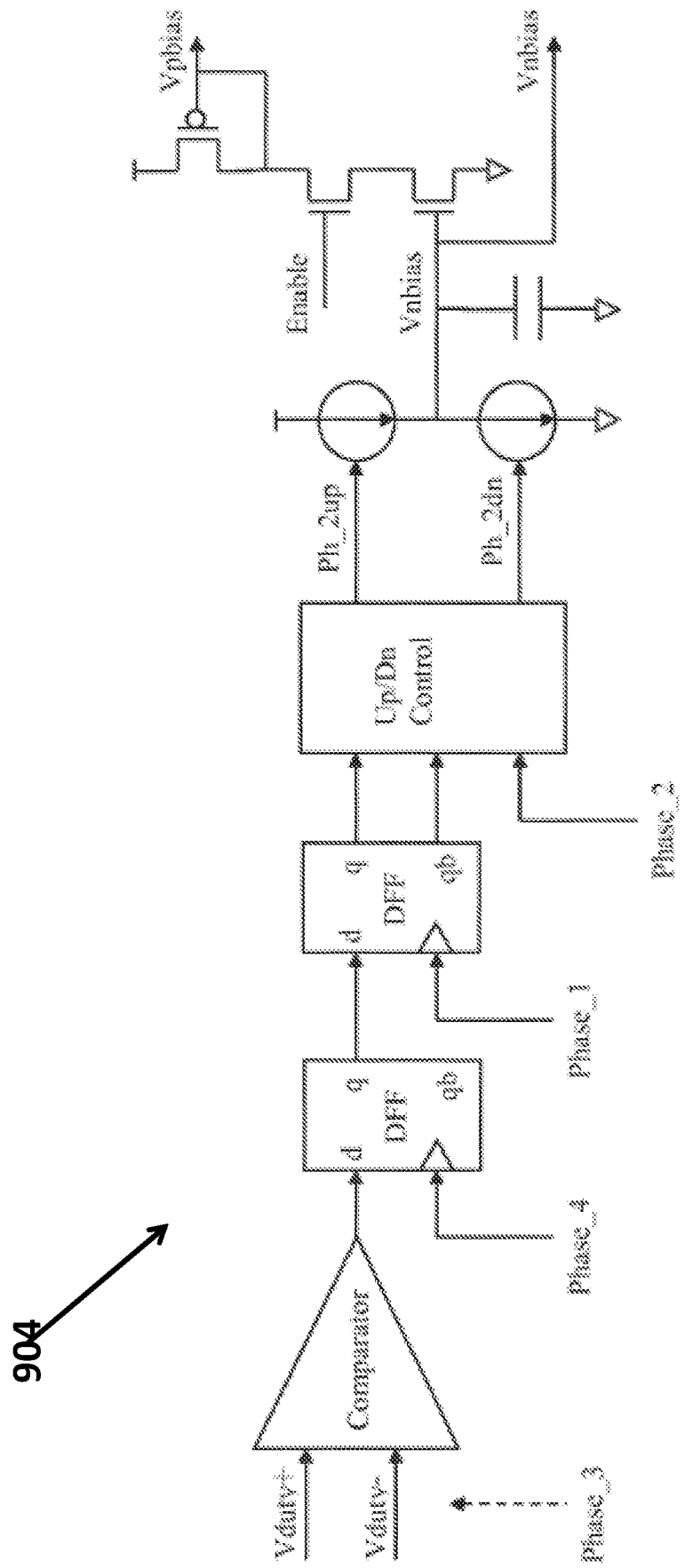
FIG. 16 is a block diagram illustrating exemplary 4-phase duty voltage to bias voltage conversion circuitry.

FIG. 15 is a block diagram illustrating aspects associated with 4-phase duty frequency tracking current source and associated circuitry 906. In particular, circuitry utilized in connection with generating the bias voltages (vpcs and vncs) is shown, including clock divider circuitry 1502, 4-phase clocks generator circuitry 1504, and a frequency tracking current source (FTCS) generation circuitry 1506. Such a 4-phase frequency tracking current source (FTCS) generation circuitry may be used to generate these bias voltages (vpcs and vncs), which are proportional to the clock frequency. In turn, these bias voltages may be utilized by the duty cycle integrator as set forth in the figure(s) above. Further, the same or a similar 4-phase clocking scheme, as used by the duty cycle integrator circuitry, may be utilized, or an optional clock frequency divider can be inserted before generating the 4-phase clocks for the frequency tracking current source (FTCS) generation circuitry. If the circuit uses the same 4-phase clock outputs from 900 in FIG. 10A, then the clock divider is not needed. Specifically, since the outputs of 1506, vpcs and vncs, are tracking with the frequency, the circuit can actually divide the frequency of CK by 2 before it is applied to the 4-phase clock generation circuit 1504 so that the clock divider is optional. FIG. 16 is a block diagram illustrating exemplary 4-phase duty voltage to bias voltage conversion circuitry 904. The duty voltage (Vduty) to bias voltage (Vbias) conversion circuitry may include comparator (shown) or comparison circuitry (not shown), a first flip-flop, a second flip-flop, control circuitry, and final phase processing circuitry to provide the pbias voltage (Vpbias) and nbias voltage (Vnbias) outputs. The positive or high duty voltage (Vduty+) and negative or low duty voltage (Vduty-) may be provided as inputs to the comparator or comparison circuitry in conjunction with the Phase 3 signal, for processing. Further, according to implementations herein, conversion of the difference between Vduty+ and Vduty- to the bias voltages Vpbias & Vnbias for controlling the Duty Cycle Adjust (DCA) circuit may be based on the same 4-phase clocking scheme mentioned before. According to other implementations, modified or derivative versions of such 4-phase clocking may be utilized.

As shown in FIG. 16, Vduty+ is proportional to the duration of high pulse of the clock signal CK, while Vduty- is proportional to the duration of low pulse of the clock signal CK. If Vduty+ is larger than Vduty-, then the duty cycle of the clock CK is more than 50%, on the other side, if Vduty- is larger than Vduty+, then the duty cycle is less than 50%. The comparator of FIG. 16 will compare Vduty+ and Vduty-, and a "high" if Vduty+ is larger than Vduty-, and output a "low" if Vduty+ is less than Vduty-. The output of the comparator is latched twice by the DFFs, first DFF using phase_4 and second DFF using Phase_1 from 1504 in FIG. 15. The output of the second DFF is then converted to UP (Ph_2up) and DOWN (Ph_2dn) signals to charge up Vnbias or discharge Vnbias (using Phase_2). For example, if Vduty+ is much larger than Vduty- (duty cycle is much greater than 50%), the output of Comparator is "high", and Ph_2up will be "high" and Ph_2dn will be "low", and Vnbias will increase (charging up). When Vnbias increased, Vpbias will decrease. The two signals Vnbias and Vpbias will feedback to Duty Cycle Adjuster (DCA) in FIG. 17 and reduce the duty cycle of the CK. This process will repeat until Vduty+ is equal to Vduty-.

FIG. 17 is a block/circuit diagram illustrating exemplary duty cycle adjustment circuitry 404. The duty cycle adjustment circuitry 404 may comprise input circuitry as well as 2 duty cycle adjustment delay chain circuits. In other implementation, additional (i.e., more than 2) duty cycle adjustment delay chain circuits may be utilized, and/or ones of differing individual circuit elements. Turning back to the presently-illustrated representative circuitry, for example, the input circuitry may receive the bias voltages Vnbias and Vpbias from the duty cycle detector circuitry. Further, the clock duty cycle may then be adjusted via two adjustable delay chains (2 duty cycle adjustment delay chain circuits), one for controlling the rising edge and the other for the falling edge. Further, with respect to such circuitry, according to one specific implementation herein, duty cycle adjustment may be configured to only change the falling edge of the clock, with the PLL using only a rising clock edge for locking, such that the PLL loop and the DCC loop both can operate at the same time without interfering each other's operation. Further, in some implementations, the duty cycle adjustment may be configured to execute/operate only after the PLL loop is locked, or both the PLL loop and the DCC loop may operate at the same time.

Figure 18:
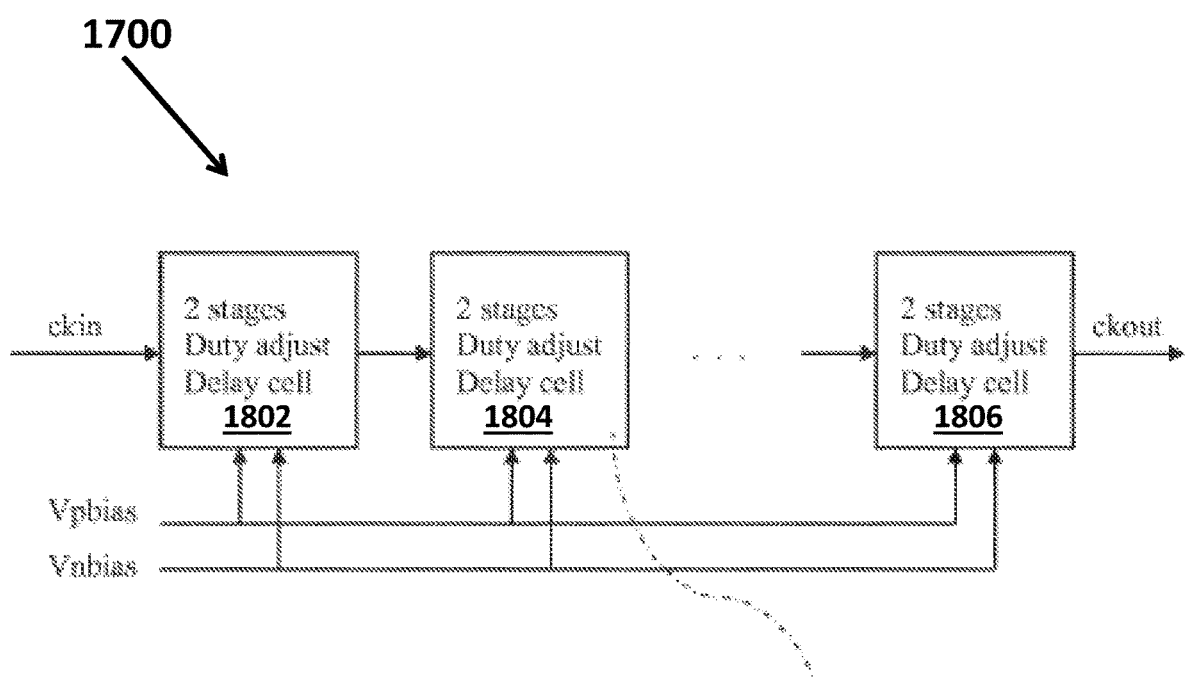
FIG. 18 is a block diagram illustrating exemplary duty cycle adjustment delay chain circuitry.

FIG. 18 is a block diagram illustrating exemplary duty cycle adjustment delay chain circuitry 1700. Referring to FIG. 18, such duty cycle adjustment delay chain circuit may include a plurality of sets (2 stages) of duty adjustment delay cells 1802-1806, each having the clock signal, Ckin, and the Vpbias and Vnbias signals as inputs. Additional detail of each such cell 1802-1806 are set forth in more detail below in connection with FIG. 19.

Figure 19:
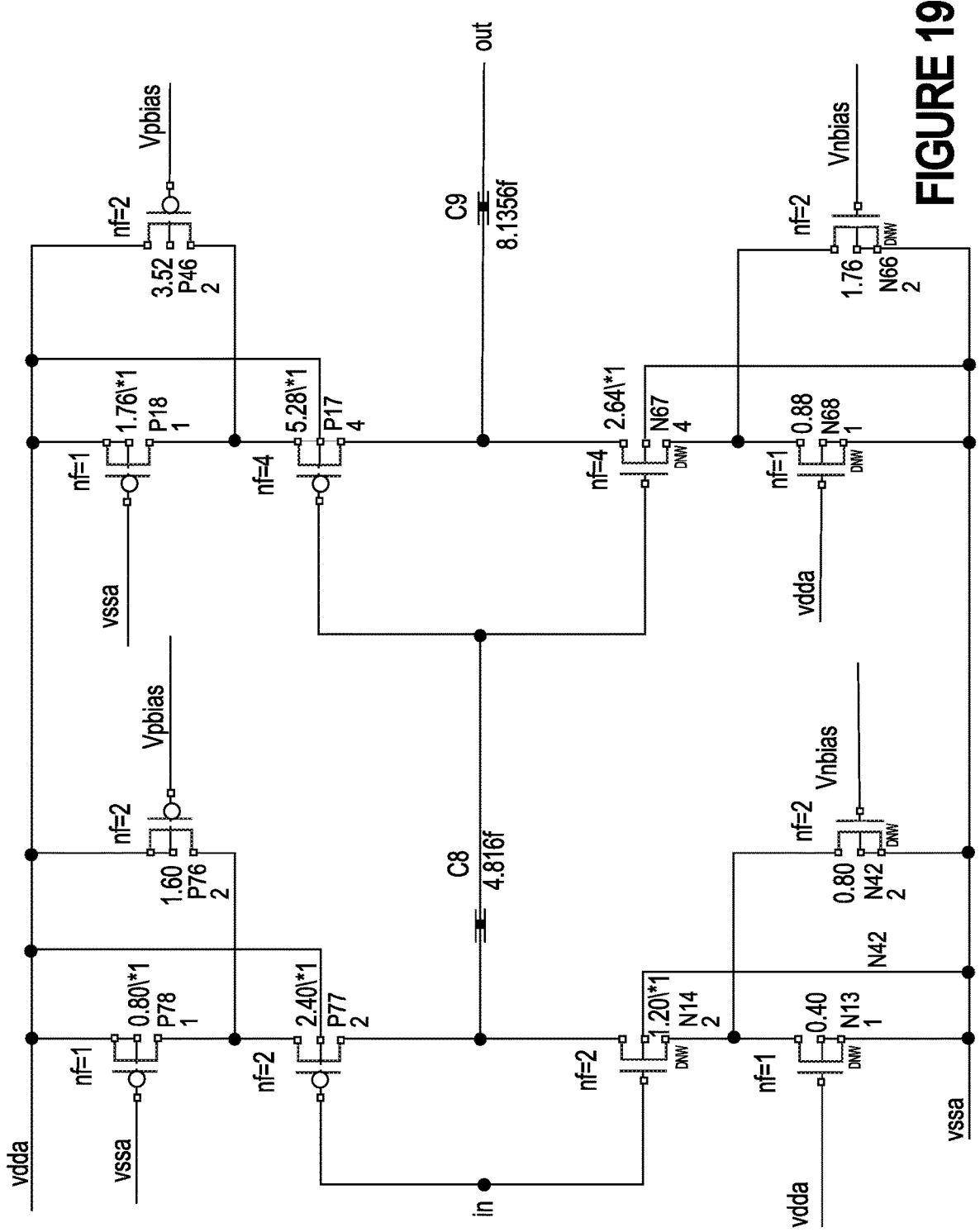
FIG. 19 is a block/circuit diagram illustrating exemplary duty cycle adjustment delay cell circuitry.

FIG. 19 is a block/circuit diagram illustrating exemplary duty cycle adjustment delay cell circuitry 1802, 1804 or 1806. As shown in FIG. 19, each such illustrative delay cell circuit may comprise an input node that receives the clock input signal, Ckin, first and second sets of transistors and/or circuit components between the voltage supply and ground that receive and process Ckin to provide an adjusted clock value to a second node, a third set of transistors and/or other circuit components coupled to the voltage supply and receive the Vpbias signal, and a fourth set of transistors and/or other circuit components coupled to ground and receiving the Vnbias signal as input.

The foregoing description, for purpose of explanation, has been described with reference to specific embodiments. However, the illustrative discussions above are not intended to be exhaustive or to limit the disclosure to the precise forms disclosed. Many modifications and variations are possible in view of the above teachings. The embodiments were chosen and described in order to best explain the principles of the disclosure and its practical applications, to thereby enable others skilled in the art to best utilize the disclosure and various embodiments with various modifications as are suited to the particular use contemplated.

The system and method disclosed herein may be implemented via one or more components, systems, servers, appliances, other subcomponents, or distributed between such elements. When implemented as a system, such systems may include an/or involve, inter alia, components such as software modules, general-purpose CPU, RAM, etc. found in general-purpose computers. In implementations where the innovations reside on a server, such a server may include or involve components such as CPU, RAM, etc., such as those found in general-purpose computers.

Additionally, the system and method herein may be achieved via implementations with disparate or entirely different software, hardware and/or firmware components, beyond that set forth above. With regard to such other components (e.g., software, processing components, etc.) and/or computer-readable media associated with or embodying the disclosure, for example, aspects of the innovations herein may be implemented consistent with numerous general purpose or special purpose computing systems or configurations. Various exemplary computing systems, environments, and/or configurations that may be suitable for use with the innovations herein may include, but are not limited to: software or other components within or embodied on personal computers, servers or server computing devices such as routing/connectivity components, hand-held or laptop devices, multiprocessor systems, microprocessor-based systems, set top boxes, consumer electronic devices, network PCs, other existing computer platforms, distributed computing environments that include one or more of the above systems or devices, etc.

In some instances, aspects of the system and method may be achieved via or performed by logic and/or logic instructions including program modules, executed in association with such components or circuitry, for example. In general, program modules may include routines, programs, objects, components, data structures, etc. that perform particular tasks or implement particular instructions herein. The disclosures may also be practiced in the context of distributed software, computer, or circuit settings where circuitry is connected via communication buses, circuitry or links. In distributed settings, control/instructions may occur from both local and remote computer storage media including memory storage devices.

The software, circuitry and components herein may also include and/or utilize one or more type of computer readable media. Computer readable media can be any available media that is resident on, associable with, or can be accessed by such circuits and/or computing components. By way of example, and not limitation, computer readable media may comprise computer storage media and communication media. Computer storage media includes volatile and non-volatile, removable and non-removable media implemented in any method or technology for storage of information such as computer readable instructions, data structures, program modules or other data. Computer storage media includes, but is not limited to, RAM, ROM, EEPROM, flash memory or other memory technology, CD-ROM, digital versatile disks (DVD) or other optical storage, magnetic tape, magnetic disk storage or other magnetic storage devices, or any other medium which can be used to store the desired information and can accessed by computing component. Communication media may comprise computer readable instructions, data structures, program modules and/or other components. Further, communication media may include wired media such as a wired network or direct-wired connection, however no media of any such type herein includes transitory media. Combinations of the any of the above are also included within the scope of computer readable media.

In the present description, the terms component, module, device, etc. may refer to any type of logical or functional software elements, circuits, blocks and/or processes that may be implemented in a variety of ways. For example, the functions of various circuits and/or blocks can be combined with one another into any other number of modules. Each module may even be implemented as a software program stored on a tangible memory (e.g., random access memory, read only memory, CD-ROM memory, hard disk drive, etc.) to be read by a central processing unit to implement the functions of the innovations herein. Or, the modules can comprise programming instructions transmitted to a general purpose computer or to processing/graphics hardware via a transmission carrier wave. Also, the modules can be implemented as hardware logic circuitry implementing the functions encompassed by the innovations herein. Finally, the modules can be implemented using special purpose instructions (SIMD instructions), field programmable logic arrays or any mix thereof which provides the desired level performance and cost.

As disclosed herein, features consistent with the disclosure may be implemented via computer-hardware, software and/or firmware. For example, the systems and methods disclosed herein may be embodied in various forms including, for example, a data processor, such as a computer that also includes a database, digital electronic circuitry, firmware, software, or in combinations of them. Further, while some of the disclosed implementations describe specific hardware components, systems and methods consistent with the innovations herein may be implemented with any combination of hardware, software and/or firmware. Moreover, the above-noted features and other aspects and principles of the innovations herein may be implemented in various environments. Such environments and related applications may be specially constructed for performing the various routines, processes and/or operations according to the disclosure or they may include a general-purpose computer or computing platform selectively activated or reconfigured by code to provide the necessary functionality. The processes disclosed herein are not inherently related to any particular computer, network, architecture, environment, or other apparatus, and may be implemented by a suitable combination of hardware, software, and/or firmware. For example, various general-purpose machines may be used with programs written in accordance with teachings of the disclosure, or it may be more convenient to construct a specialized apparatus or system to perform the required methods and techniques.

Aspects of the method and system described herein, such as the logic, may also be implemented as functionality programmed into any of a variety of circuitry, including programmable logic devices ("PLDs"), such as field programmable gate arrays ("FPGAs"), programmable array logic ("PAL") devices, electrically programmable logic and memory devices and standard cell-based devices, as well as application specific integrated circuits. Some other possibilities for implementing aspects include: memory devices, microcontrollers with memory (such as EEPROM), embedded microprocessors, firmware, software, etc. Furthermore, aspects may be embodied in microprocessors having software-based circuit emulation, discrete logic (sequential and combinatorial), custom devices, fuzzy (neural) logic, quantum devices, and hybrids of any of the above device types. The underlying device technologies may be provided in a variety of component types, e.g., metal-oxide semiconductor field-effect transistor ("MOSFET") technologies like complementary metal-oxide semiconductor ("CMOS"), bipolar technologies like emitter-coupled logic ("ECL"), polymer technologies (e.g., silicon-conjugated polymer and metal-conjugated polymer-metal structures), mixed analog and digital, and so on.

It should also be noted that the various logic and/or functions disclosed herein may be enabled using any number of combinations of hardware, firmware, and/or as data and/or instructions embodied in various machine-readable or computer-readable media, in terms of their behavioral, register transfer, logic component, and/or other characteristics. Computer-readable media in which such formatted data and/or instructions may be embodied include, but are not limited to, non-volatile storage media in various forms (e.g., optical, magnetic or semiconductor storage media) though again does not include transitory media. Unless the context clearly requires otherwise, throughout the description, the words "comprise," "comprising," and the like are to be construed in an inclusive sense as opposed to an exclusive or exhaustive sense; that is to say, in a sense of "including, but not limited to." Words using the singular or plural number also include the plural or singular number respectively. Additionally, the words "herein," "hereunder," "above," "below," and words of similar import refer to this application as a whole and not to any particular portions of this application. When the word "or" is used in reference to a list of two or more items, that word covers all of the following interpretations of the word: any of the items in the list, all of the items in the list and any combination of the items in the list.

Although certain presently preferred implementations of the disclosure have been specifically described herein, it will be apparent to those skilled in the art to which the disclosure pertains that variations and modifications of the various implementations shown and described herein may be made without departing from the spirit and scope of the disclosure. Accordingly, it is intended that the disclosure be limited only to the extent required by the applicable rules of law.

While the foregoing has been with reference to a particular embodiment of the disclosure, it will be appreciated by those skilled in the art that changes in this embodiment may be made without departing from the principles and spirit of the disclosure, the scope of which is defined by the appended claims.

The invention claimed is:

1. A locked loop circuitry, comprising:
a main loop comprising:
a first lock loop circuit that generates a signal;
a duty cycle adjust circuit coupled to the first lock loop circuit that receives two control signals to adjust a duty cycle of the signal from the first lock loop and output a clock signal; and
a clock tree coupled to the duty cycle adjust circuit that outputs a clock signal fed back to the first lock loop circuit;
a duty cycle detection circuit outside of the main loop coupled to the clock signal output from the clock tree that generates a signal proportional to a duration of a high pulse of the clock signal and a signal portional to a duration of a low pulse of the clock signal and generates the two control signals in response to a detected duty cycle of the clock signal, wherein a first of the two control signals increases when the signal proportional to the duration of a high pulse of the clock signal is larger than the signal portional to a duration of a low pulse of the clock signal and a second of the two control signal decreases; and
wherein the duty cycle adjust circuit adjusts the duty cycle of the signal from the first lock loop in response to the first and second control signals.

2. The circuitry of claim 1, wherein the output of the clock tree is input to the first lock loop circuit along a first feedback path, and wherein the output of the duty cycle detection circuit is input to the duty cycle adjust circuit along a second feedback path, wherein the first feedback path is independent of the second feedback path.

3. The circuitry of claim 2, wherein the first feedback path excludes the duty cycle detection circuit.

4. The circuitry of claim 1, wherein the duty cycle adjust circuit adjusts a duty cycle of a clock signal output from the first lock loop circuitry.

5. The circuitry of claim 1, wherein the input to the duty cycle adjust circuit is one or more voltage control signals.

6. The circuitry of claim 1, wherein the input to the duty cycle adjust circuit is one or more current control signals.

7. The circuitry of claim 1, wherein the input to the duty cycle adjust circuit is two control signals and the duty cycle adjust circuit adjusts a duty cycle of a clock signal output from the first lock loop circuitry.

8. The circuitry of claim 7, wherein one of an increase and a decrease of the two control signals changes the duty cycle.

9. The circuitry of claim 7, wherein one of an increase and a decrease of a first control signal and one of a decrease and increase, respectively of a second control signal changes the duty cycle.

10. The circuitry of claim 1, wherein the first lock loop circuit is one of a phase lock loop and a delay lock loop.

11. Lock loop circuitry, comprising:
a lock loop circuit for locking a rising edge of a clock;
a duty cycle adjust circuit coupled to the lock loop circuit that receives two control signals to adjust a duty cycle of the output signal from the lock loop circuit and output a clock signal;
a clock tree coupled to the duty cycle adjust circuit that outputs a clock signal fed back to the first lock loop circuit and form a main loop; and
a duty cycle detection circuit outside of the main loop coupled to the clock signal output from the clock tree, generates a signal proportional to a duration of a high pulse of the clock signal and a signal portional to a duration of a low pulse of the clock signal and generates the two control signals in response to a detected duty cycle of the clock signal, wherein a first of the two control signals increases when the signal proportional to the duration of a high pulse of the clock signal is larger than the signal portional to a duration of a low pulse of the clock signal and a second of the two control signal decreases; and
wherein the duty cycle adjust circuit modifies the falling edge of the clock from the lock loop circuit in response to the first and second control signals.

12. The circuitry of claim 11, wherein the output of the clock tree is input to the lock loop circuit along a first feedback path, and wherein the output of the duty cycle detection circuit is input to the duty cycle adjust circuit along a second feedback path, wherein the first feedback path is independent of the second feedback path.

13. The circuitry of claim 12, wherein the first feedback path excludes the duty cycle detection circuit.

14. The circuitry of claim 11, wherein the duty cycle adjust circuit adjusts a duty cycle of a clock signal output from the first lock loop circuitry.

15. The circuitry of claim 11, wherein the input to the duty cycle adjust circuit is one or more voltage control signals.

16. The circuitry of claim 11, wherein the input to the duty cycle adjust circuit is one or more current control signals.

17. The circuitry of claim 11, wherein the input to the duty cycle adjust circuit is two control signals and the duty cycle adjust circuit adjusts a duty cycle of a clock signal output from the first lock loop circuitry.

18. The circuitry of claim 17, wherein one of an increase and a decrease of the two control signals changes the duty cycle.

19. The circuitry of claim 17, wherein one of an increase and a decrease of a first control signal and one of a decrease and increase, respectively of a second control signal changes the duty cycle.

20. The circuitry of claim 11, wherein the lock loop circuit is one of a phase lock loop and a delay lock loop.

21. A semiconductor memory, comprising:
a clock circuit;
an array of memory elements; and
the clock circuit further comprising a main loop including a first lock loop circuit that generates a signal, a duty cycle adjust circuit coupled to the first lock loop circuit that receives two control signals to adjust a duty cycle of the signal from the first lock loop circuit and output a clock signal and a clock tree coupled to the duty cycle adjust circuit that outputs a clock signal fed back to the first lock loop circuit and a duty cycle detection circuit outside of the main loop coupled to the clock signal output from the clock tree that generates a signal proportional to a duration of a high pulse of the clock signal and a signal portional to a duration of a low pulse of the clock signal and generates the two control signals in response to a detected duty cycle of the clock signal, wherein a first of the two control signals increases when the signal proportional to the duration of a high pulse of the clock signal is larger than the signal portional to a duration of a low pulse of the clock signal and a second of the two control signal decreases; and wherein the duty cycle adjust circuit adjusts the duty cycle of the signal from the first lock loop in response to the first and second a change in a first of the two control signals and an opposite change in a second of the two control signals.

22. The circuitry of claim 21, wherein the output of the clock tree is input to the first lock loop circuit along a first feedback path, and wherein the output of the duty cycle detection circuit is input to the duty cycle adjust circuit along a second feedback path, wherein the first feedback path is independent of the second feedback path.

23. The circuitry of claim 22, wherein the first feedback path excludes the duty cycle detection circuit.

24. The circuitry of claim 21, wherein the duty cycle adjust circuit adjusts a duty cycle of a clock signal output from the first lock loop circuitry.

25. The circuitry of claim 21, wherein the input to the duty cycle adjust circuit is one or more voltage control signals.

26. The circuitry of claim 21, wherein the input to the duty cycle adjust circuit is one or more current control signals.

27. The circuitry of claim 21, wherein the input to the duty cycle adjust circuit is two control signals and the duty cycle adjust circuit adjusts a duty cycle of a clock signal output from the first lock loop circuitry.

28. The circuitry of claim 27, wherein one of an increase and a decrease of the two control signals changes the duty cycle.

29. The circuitry of claim 27, wherein one of an increase and a decrease of a first control signal and one of a decrease and increase, respectively of a second control signal changes the duty cycle.

30. The circuitry of claim 21, wherein the first lock loop circuit is one of a phase lock loop and a delay lock loop.

* * * * *